United States Patent
Takahashi et al.

(10) Patent No.: US 6,714,479 B2
(45) Date of Patent: Mar. 30, 2004

(54) SEMICONDUCTOR MEMORY AND CONTROL METHOD

(75) Inventors: Hiroyuki Takahashi, Tokyo (JP); Masatoshi Sonoda, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/333,935

(22) PCT Filed: Jul. 26, 2001

(86) PCT No.: PCT/JP01/06431
§ 371 (c)(1),
(2), (4) Date: Jan. 23, 2003

(87) PCT Pub. No.: WO02/09118
PCT Pub. Date: Jan. 31, 2002

(65) Prior Publication Data
US 2003/0151964 A1 Aug. 14, 2003

(30) Foreign Application Priority Data
Jul. 26, 2000 (JP) .................................... 2000-225763

(51) Int. Cl.⁷ .................................................. G11C 7/00
(52) U.S. Cl. ...................... 365/233.5; 365/222; 365/206
(58) Field of Search ................................. 365/233.5, 222, 365/206

(56) References Cited

U.S. PATENT DOCUMENTS 4,984,208 A   1/1991   Sawada et al. ............ 365/222
5,710,740 A * 1/1998   Manning .................... 365/222

FOREIGN PATENT DOCUMENTS

| DE | 37 87 187 T2 | 9/1987 |
| EP | 0 237 785 A2 | 2/1987 |
| JP | 62-188095 | 8/1987 |
| JP | 3-12095 | 1/1991 |
| JP | 5-81888 | 4/1993 |
| JP | 11-39876 | 2/1999 |
| KR | 91-2499 | 2/1986 |

* cited by examiner

Primary Examiner—Vu Anh Le
(74) Attorney, Agent, or Firm—Choate, Hall & Stewart (57) ABSTRACT

The present invention provides a semiconductor memory device and control method capable of effectively suppressing the generation of operating current originating in noise of address signals provided from the outside without impairing the operating speed during reading and writing. This semiconductor memory device is provided with a filter circuit (102) for removing noise contained in address signals provided from the outside, a circuit system containing an ATD circuit (311) for generating a first address transition detection signal (φATD1) by detecting a change in an address signal prior to passing through the filter circuit (102), and a circuit system containing an ATD circuit (321) for generating a second address transition detection signal (φATD2) by detecting a change in an address signal after passing through the filter circuit (102). Refresh operation is controlled by first address transition detection signal (φATD1), while read/write operation is controlled by second address transition detection signal (φATD2). As a result, only the refresh operation is performed in the case noise has been generated, and the generation of operating current is effectively suppressed.

14 Claims, 7 Drawing Sheets

SEMICONDUCTOR MEMORY AND CONTROL METHOD

TECHNICAL FIELD

The present invention relates to a semiconductor memory device provided with an address transition detection (ATD) circuit for detecting a transition in an externally provided address signal, and more particularly, to a semiconductor memory device and control method composed so as to perform a refresh operation and read/write operation using a pulse signal output from an ATD circuit as a trigger.

BACKGROUND ART

In the past, so-called pseudo SRAM were used as semiconductor memory devices composed so as to be able to be handled in the manner of SRAM (Static Random Access Memory) despite consisting primarily of DRAM (Dynamic Random Access Memory). These pseudo SRAM employ an internal synchronization scheme that operates by detecting a transition in an address signal, and are equipped with an address transition detection circuit (abbreviated as ATD circuit, or address transition detector) for detecting a transition in an externally provided address signal. In the case of this pseudo SRAM, although it is difficult to obtain high-speed performance in the manner of regular SRAM having memory cells comprised of flip-flops since it consists primarily of DRAM, pseudo SRAM are able to realize large-scale storage capacity comparable to DRAM.

Figure 7:
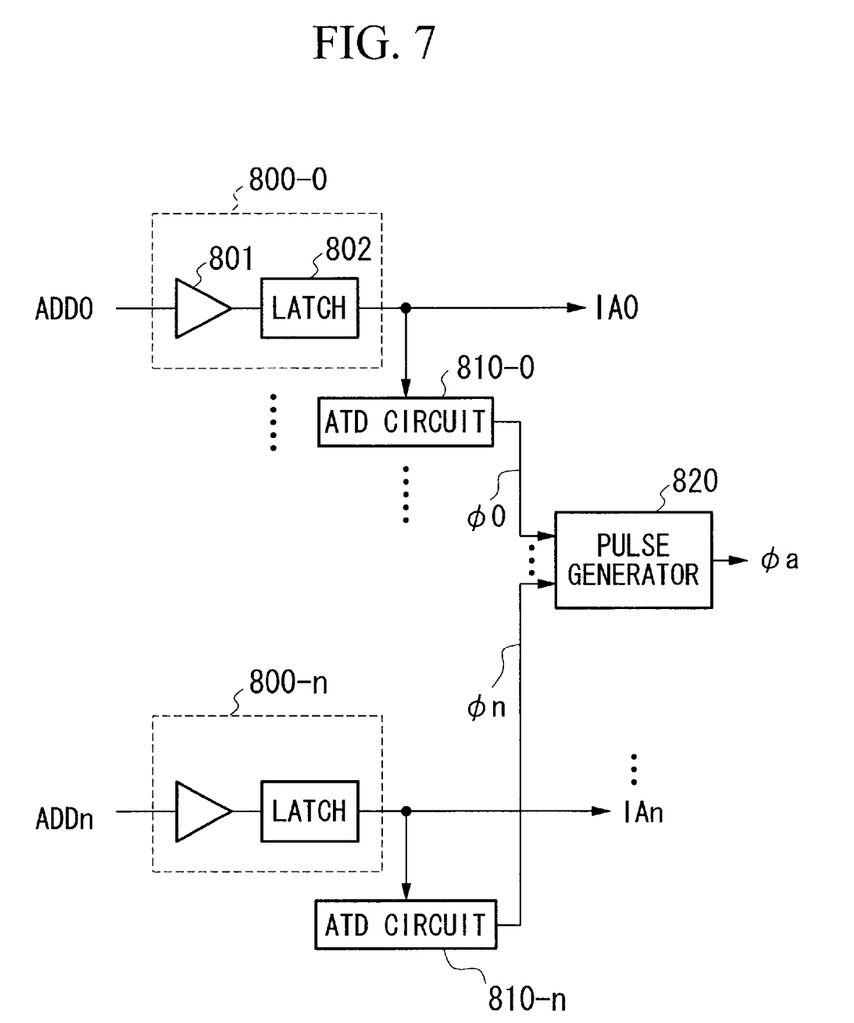
FIG. 7 is a block diagram showing an example of the constitution of an address input system provided by a semiconductor memory device according to the background art.

FIG. 7 shows an example of the configuration of an address input system of a pseudo SRAM provided with an ATD circuit. Address signals ADD0 to ADDn (n is a natural number) are address signals applied from the outside. Address input circuits 800-0 to 800-n are provided corresponding to these address signals ADD0 through ADDn, and each of these address input circuits is composed of an input buffer 801 and latch circuit 802. In addition, ATD circuits 810-0 to 810-n are provided for the outputs of each address input circuit, and each of the output signals of these ATD circuits are input to pulse generator 820.

Here, input buffers 801 of address input circuits 800-0 to 800-n receive externally provided address signals (ADD0 to ADDn), and convert them to internal device address signals. In addition, latch circuits 802 latch address signals output from input buffers 801 based on a control signal output from a prescribed control circuit system not shown in the case an external address signal has changed, and normally, allow the output signals of input buffers 801 to pass through as internal address signals (IA0 to IAn).

ATD circuits 810-0 to 810-n generate positive one-shot pulses φ0 to φn by detecting a change (transition) in internal address signals IA0 to IAn output from latch circuits 802 of address input circuits 800-0 to 800-n. Pulse generator 802 receives one-shot pulses φ0 to φn output from ATD circuits 810-0 to 810-n, and generates a pulse address transition detection signal φa having a prescribed pulse width. Various types of control signals required for operation of each section are then derivatively generated based on this pulse address transition detection signal φa.

According to a semiconductor memory device of the background art equipped with this type of address input system, in the case address signals ADD0 to ADDn provided from the outside are in a steady state without changing, address signals incorporated from the outside through input buffers 801 in each of address input circuits 800-0 to 800-n pass through latch circuits 802 in the through state, and are provided to, for example, a pre-decoding circuit of a latter stage as internal address signals IA0 to IAn. In this state, since there is no change in the address signals, ATD circuits 810-0 to 810-n do not generate one-shot pulses φ0 to φn, and pulse address transition detection signal φa is held at the low (L) level.

In FIG. 7, if, for example, an externally provided address signal ADD0 changes from this state, internal address signal IA0 output from input buffer 801 through latch circuit 802 in the through state changes. ATD circuit 810-0 detects this change in address signal IA0, and generates one-shot pulse φ0. Pulse generator 802 then receives one-shot pulse φ0 generated with ATD circuit 810-0, and outputs a pulse signal as pulse address transition detection signal φa.

Similarly, if other externally provided address signals ADD1 to ADDn change, pulse generator 802 receives a one-shut pulse generated with each ATD circuit, and outputs pulse address transition detection signal φa. Control signals required for memory cell refresh operation or control signals required for read/write operation are generated in a control signal generation circuit system not shown in the drawings based on this pulse address transition detection signal φa, and various operations within the device are controlled at the appropriate timing.

However, in the case of the above pseudo SRAM, due to its specifications, a constitution is employed in which both the operations of refresh operation and read/write operation are performed consecutively within the same cycle based on a common pulse address transition detection signal φa. Consequently, if noise is contained in externally provided address signals ADD0 to ADDn, one-shut pulses φ0 to φn are generated following a malfunction of ATD circuits 810-0 to 810-n due to this noise. As a result, the refresh operation and read/write operation are consecutively performed incorrectly, and since the majority of the circuits that compose the semiconductor memory device operate, a large operating current is generated that results in the problem of increased current consumption.

A first example of the background art that attempts to solve problems caused by this type of ATD circuit malfunction is the semiconductor memory device disclosed in Japanese Unexamined Patent Application, First Publication No. Hei 3-12095. This semiconductor memory device is provided with a first address transition detection circuit that generates a pulse signal for controlling the read operation until immediately before an output buffer, and a second address transition detection circuit that generates a pulse signal for controlling operation beyond the output buffer, and a filter is provided in a prior stage of this second address transition detection circuit for removing noise contained in address signals.

According to this device, even if apparent noise is contained in address signals caused by fluctuation in ground potential Vss accompanying operation of the output buffer, this noise is removed by a filter. Thus, the second address transition detection circuit that generates a pulse signal for controlling output buffer operation does not malfunction due to this noise, and malfunction of the output buffer also no longer occurs caused by spontaneously generated ground potential noise. In addition, in this device, since the operation of the circuit system until immediately before the output buffer, which determines the majority of read time, is controlled by a pulse signal from the first address transition detection circuit that inputs address signals without going through a filter, high-speed performance is not impaired. However, this semiconductor memory device according to this first example of the background art prevents malfunctions caused by fluctuation of ground potential Vss accompanying output buffer switching, and in the case the refresh operation and read/write operation are performed within the same cycle, is unable to suppress the generation of operating current caused by noise contained in an address.

In addition, a second example of a device according to the background art is the semiconductor integrated circuit disclosed in Japanese Unexamined Patent Application, First Publication No. Hei 5-81888. This semiconductor integrated circuit is provided with an ATD circuit (to be referred to as the first ATD circuit) for detecting transitions in address signals, a noise filter for removing noise from addresses, and an ATD circuit (to be referred to as the second ATD circuit) for detecting transitions in address signals from which noise has been removed by the noise filter. The former first ATD circuit is used for control of internal operation at the stage before the output buffer (latching of data), while the latter second ATD circuit is used for control of the output signal in the state prior to a regular output signal being output (output preset).

According to this second example of the background art, in the reading of data, the output level of the output buffer slowly changes from high (H) to low (L) under the control of the pulse signal output from the second ATD circuit. As a result, ground noise during reading of "L" is reduced. In addition, tolerance to power source noise is improved by latching data until that time internally under the control of a pulse signal output from the first ATD circuit. In addition, erroneous preset of output caused by power source noise is prevented by removing power source noise with a noise filter. However, this second example of the background art also prevents malfunctions caused by noise accompanying output buffer switching, and similar to the first example of the background art mentioned above, in the case the refresh operation and read/write operation are performed within the same cycle, the generation of operating current caused by noise contained in address signals cannot be suppressed.

DISCLOSURE OF THE INVENTION

In consideration of the above circumstances, the object of the present invention is to provide a semiconductor memory device and control method that is capable of effectively suppressing the generation of operating current caused by noise of address signals provided from the outside without inhibiting operating speed during reading and writing.

In order to solve the above problems, the semiconductor memory device according to the present invention is provided with: a memory cell array composed by arranging memory cells containing data storage capacitors in a matrix; a filter circuit that removes noise contained in an address signal provided from the outside (for example, a constituent feature corresponding to noise filter circuit 102 to be described later); a first signal transition detection circuit system that generates a first pulse signal for controlling refresh operation by detecting a change in an address signal prior to passing through the filter circuit (for example, a constituent feature corresponding to the circuit system composed of address transition detection circuit 311 and pulse composition circuit 312 to be described later); a second signal transition detection circuit system that generates a second pulse signal for controlling read/write operation by detecting a change in an address signal after passing through the filter circuit (for example, a constituent feature corresponding to a circuit system composed of an address transition detection circuit 321 and a pulse composition circuit 322 to be described later); and a control system that sequentially performs the refresh operation and the read/write operation within the same cycle by using the first and second pulse signals as triggers.

According to this constitution, the refresh operation is started in the case a change is detected in an address signal prior to passing through the filter circuit, and a normal read/write operation is started in the case a change is detected in an address signal after having passed through the filter circuit. Here, in the case noise is contained in an address signal provided from the outside, that address signal is provided to the second signal transition detection circuit system following removal of that noise by the filter circuit. Thus, the second address signal is not output due to noise contained in the address signal, and there is no malfunction of starting the read/write operation. In addition, since noise is contained in address signals prior to passing through the filter circuit, the first signal transition detection circuit system that inputs this address signal outputs a first pulse signal, and the refresh operation is started. Namely, in the case noise is contained in an address signal provided from the outside, only the refresh operation is performed, while the read/write operation is not performed.

In contrast, in the case noise is not contained in an address signal provided from the outside, a change in the external address signal is respectively detected by the first and second signal transition detection circuit systems, and first and second pulse signals are output. The refresh operation and read/write operation are then sequentially performed within the same cycle by using these first and second pulse signals as triggers. At this time, the second pulse signal is output at a delay relative to the first pulse signal that is equal to the delay time in the filter circuit. However, since the read/write operation is performed in succession after the refresh operation, there is no problem with the second pulse signal that serves as the trigger of the read/write operation being delayed relative to the first pulse signal that serves as the trigger of the refresh operation, and the operating speed of the read/write operation is not impaired.

Thus, according to this constitution, even if noise is contained in an address signal, and an apparent change has occurred in the address signal due to this noise, the generation of operating current due to the read/write operation can be suppressed, and there is also no impairment of operating speed of the normal read/write operation.

In the semiconductor memory device according to the present invention, the second signal transition detection circuit system may be made to, for example, control the first signal transition detection circuit system in an inactive state by detecting a change in an address signal that has passed through the filter circuit. According to this constitution, even if noise is generated in an address signal during read/write operation following refresh operation, a first pulse signal is not output from the first signal transition detection circuit system. Thus, the refresh operation is not erroneously started during the read/write operation, and destruction of data can be prevented.

Moreover, in the semiconductor memory device according to the present invention, the control system may be made to, for example, control the refresh operation based on the first pulse signal, while also controlling the read/write operation based on the second pulse signal (for example, a constituent feature corresponding to the circuit system containing an address multiplexer 5 to be described later). According to this constitution, the refresh operation is able to start by using a first pulse signal as a trigger, while the read/write operation is able to start by using a second pulse signal as a trigger.

Moreover, in the semiconductor memory device according to the present invention, a row decoder circuit for selecting a row of the memory cell array is additionally provided, and the control system may be composed to include an address multiplexer (for example, a constituent feature corresponding to address multiplexer 5 to be described later) that selects either a read/write address signal generated from an address signal that has passed through the filter circuit or a refresh address signal generated in advance within the device based on the first and second pulse signals, and supplies a selected address signal to the row decoder circuit. According to this constitution, in the case a change is detected in an address signal provided from the outside, a refresh address signal can be supplied to the row decoder based on the first pulse signal, and a read/write address signal can be supplied to the row decoder based on the second pulse signal. Thus, the required address signals can be obtained in each of the refresh and read/write operations.

Moreover, in the semiconductor memory device according to the present invention, the filter circuit may be composed to, for example, include a delay circuit having a delay amount corresponding to the pulse width of presumed noise targeted for removal. According to this constitution, the delay time in the filter can be held to the required minimum amount for removal of noise contained in the address signal. Thus, the apparent decrease in sensitivity of the second signal transition detection circuit system that includes the filter circuit can be held to a minimum.

Moreover, in the semiconductor memory device according to the present invention, the filter circuit may be a flip-flop that directly inputs the address signal from the outside. According to this constitution, noise does not substantially penetrate inside as long as the stable state of the flip-flop is not inverted. Thus, the operation of the second signal transition detection circuit system that detects changes in a signal that has passed through the filter circuit can be further stabilized.

Moreover, in the semiconductor memory device according to the present invention, the filter circuit may, for example, have characteristics that remove noise that causes an address signal provided from the outside to change to the H level in the case the address signal is at the L level. According to this constitution, in the case, for example, the ground level inside the semiconductor memory device has fluctuated, apparent noise generated in the address signal can be removed.

Moreover, in the semiconductor memory device according to the present invention, the second signal transition detection circuit system may be made to prohibit read/write operation by the control system by detecting a change in an address signal that has passed through the filter circuit.

BEST MODE FOR CARRYING OUT THE INVENTION

The following provides an explanation of embodiments of the present invention with reference to the drawings.
<First Embodiment>

The semiconductor memory device according to the first embodiment of the present invention is a so-called pseudo SRAM that operates with the same specifications as an SRAM (Static Random Access Memory) while using the same memory cells as a DRAM (Dynamic Random Access Memory), and is composed so as to be able to perform a refresh operation and read/write operation within the same cycle by generating a pulse signal by detecting a change in an externally input address signals and chip select signal, and using that pulse signal as a trigger. Furthermore, in this explanation, the "read/write operation" may refer to either a "read operation" or a "write operation".

Figure 1:
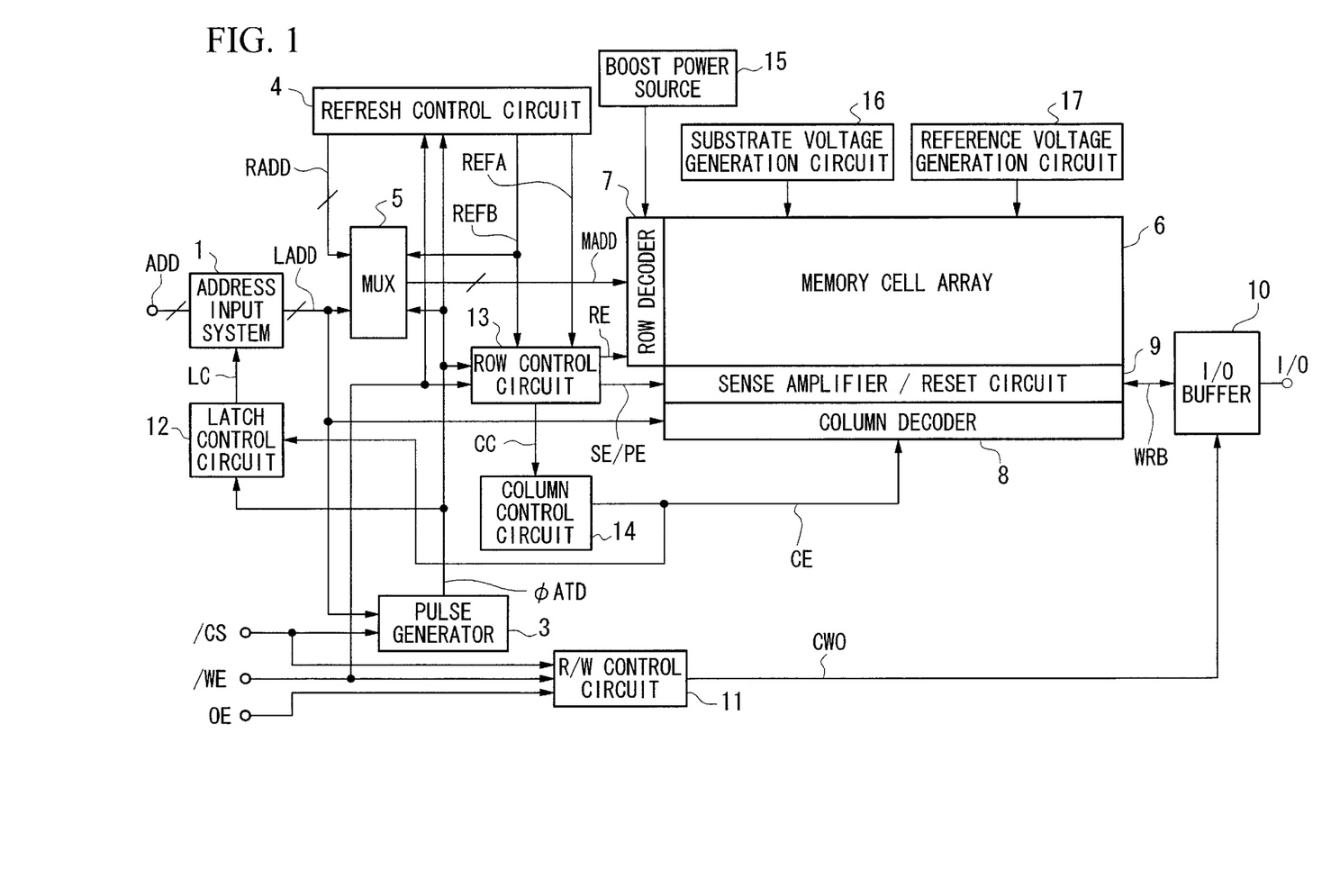
FIG. 1 is a block diagram showing the entire constitution of a semiconductor memory device according to a first embodiment of the present invention.

FIG. 1 shows the entire constitution of a semiconductor memory device according to this first embodiment.

In the drawing, address ADD is a signal provided from the outside to the semiconductor memory device, is composed of each of the bit signals of address signals ADD0 to ADDn (n is natural number), and contains a row address for specifying the row of a memory cell array to be described later, and a column address for specifying a column. Address input system 1 incorporates and latches address ADD inside the semiconductor memory device, and generates internal address LADD. This address input system 1, and a pulse generator 3 and address multiplexer 5 to be described later constitute the characteristic portions of the present invention.

Pulse generator 3 detects a change in internal address LADD in the case chip select signal /CS is in the active state, and outputs a positive one-shot pulse in the form of address transition detection signal φATD. In addition, this pulse generator 3 also outputs a positive one-shot pulse in the case chip select signal /CS changes from the inactive state (H level) to the active state (L level). Furthermore, this chip select signal /CS is the uppermost control signal for controlling the operating status of the semiconductor memory device, and puts the semiconductor memory device into the standby state when at the H level, or into the active state when at the L level.

Refresh control circuit 4 contains an internal address counter that generates an address for refreshing (to be referred to as a refresh address) RADD for selecting a row of a memory cell array during refresh operation, and an internal refresh timer for timing the refresh time interval (neither are shown in the drawing). This refresh control circuit 4 automatically generates refresh address RADD at a prescribed timing based on address transition detection signal φATD output from the above pulse generator 3, and write enable signal /WE that is a type of control signal provided from the outside, and realizes a refresh operation that is similar to the self refresh in general-purpose DRAM.

Namely, refresh control circuit 4 times the elapsed time from the time an access request is last received from the outside, and starts self refresh internally in the case that elapsed time exceeds a prescribed refresh time. Consequently, the refresh timer is composed so as to be reset and resume timing each time a positive pulse in the form of address transition detection signal φATD is output. In addition, the refresh timer generates refresh control signals REFA and REFB for controlling refresh timing. Here, refresh control signal REFA is a signal for controlling whether or not refresh is performed accompanying an access request from the outside, and if this signal is at the H level, refresh is performed, while if it is at the L level, refresh is not performed. On the other hand, refresh control signal REFB is a signal that is used to control a self refresh operation. Namely, refresh is started in the case a negative one-shot pulse is generated in the form of refresh control signal REFB.

Address multiplexer (MUX) 5 suitably selects internal address LADD or refresh address RADD corresponding to the levels of address transition detection signal φATD and refresh control signal REFB, and supplies this to row decoder 7 in the form of address MADD. Namely, if address transition detection signal φATD is at the L level and refresh control signal REFB is at the H level, a row address contained in internal address LADD is selected and this is output as address MADD after a predetermined amount of time after the rise of address transition detection signal φATD has elapsed.

In addition, in the case address transition detection signal φATD is at the H level or refresh control signal REFB is at the L level, refresh address RADD is selected and output as address MADD after a predetermined amount of time after the fall of address transition detection signal φATD has elapsed.

Next, as in general-purpose DRAM, memory cell array 6 is composed by arranging memory cells containing data storage capacitors (1 capacitor-1 transistor type) in a matrix, word lines and bit lines (or bit line pairs) are wired in the direction of the rows and columns, respectively, and memory cells are arranged at prescribed intersections of these word lines and bit lines. Row decoder 7 decodes address MADD in the case row enable signal RE output from row control circuit 13 to be described later is at the H level, and the word line belonging to the row specified with this address MADD is driven to the H level. Furthermore, the H level of a word line is defined by the boost potential that is supplied from boost power source 15 to be described later. Column decoder 8 decodes a column address contained in internal address LADD in the case column enable signal CE output from column control circuit 14 to be described later is at the H level, and generates a column select signal (not shown) for selecting a bit line belonging to the column designated with this column address.

Sense amplifier/reset circuit 9 is composed of a sense amplifier, column switch and precharge circuit not shown in the drawing. Among these, the column switch connects the sense amplifier specified with the column select signal output from column decoder 8 with bus WRB. In the case sense amplifier enable signal SE is at the H level, the sense amplifier senses and amplifies the potential of the bit line during read operation and outputs it to bus WRB, and write data supplied to bus WRB during write operation is written to the memory cells. The precharge circuit precharges the potential of the bit line to a prescribed potential (e.g., potential equal to ½ power source voltage Vdd) in the case precharge enable signal PE output from row control circuit 13 is at the H level. I/O buffer (input buffer) 10 performs input and output of data between the semiconductor memory device and the outside corresponding to the level of control signal CWO output from R/W control circuit 11 to be described later.

Next, R/W (read/write) control circuit 11 generates a control signal CWO for controlling read operation and write operation based on chip select signal /CS, write enable signal /WE and output enable signal OE, and provides this to I/O buffer 10. Latch control circuit 12 generates a latch control signal LC (positive one-shot pulse) using the falling edge of address transition detection circuit φATD as a trigger. Row control circuit 13 generates row enable signal RE, sense amplifier enable signal SE, precharge enable circuit PE and control signal CC based on the previously mentioned refresh control signal REFA, refresh control signal REFB, address transition detection signal φATD and write enable signal /WE.

Column control circuit 14 generates column enable signal CE based on control signal CC. Boost power source 15 is a power source that supplies the boost potential applied to the word lines in memory cell array 6 to row decoder 7. In addition, substrate voltage generation circuit 16 generates a potential that is applied to the well or semiconductor substrate in which memory cells are formed. Reference voltage generation circuit 17 generates a reference voltage that is used within memory cell array 6 and sense amplifier/reset circuit 9.

Figure 2:
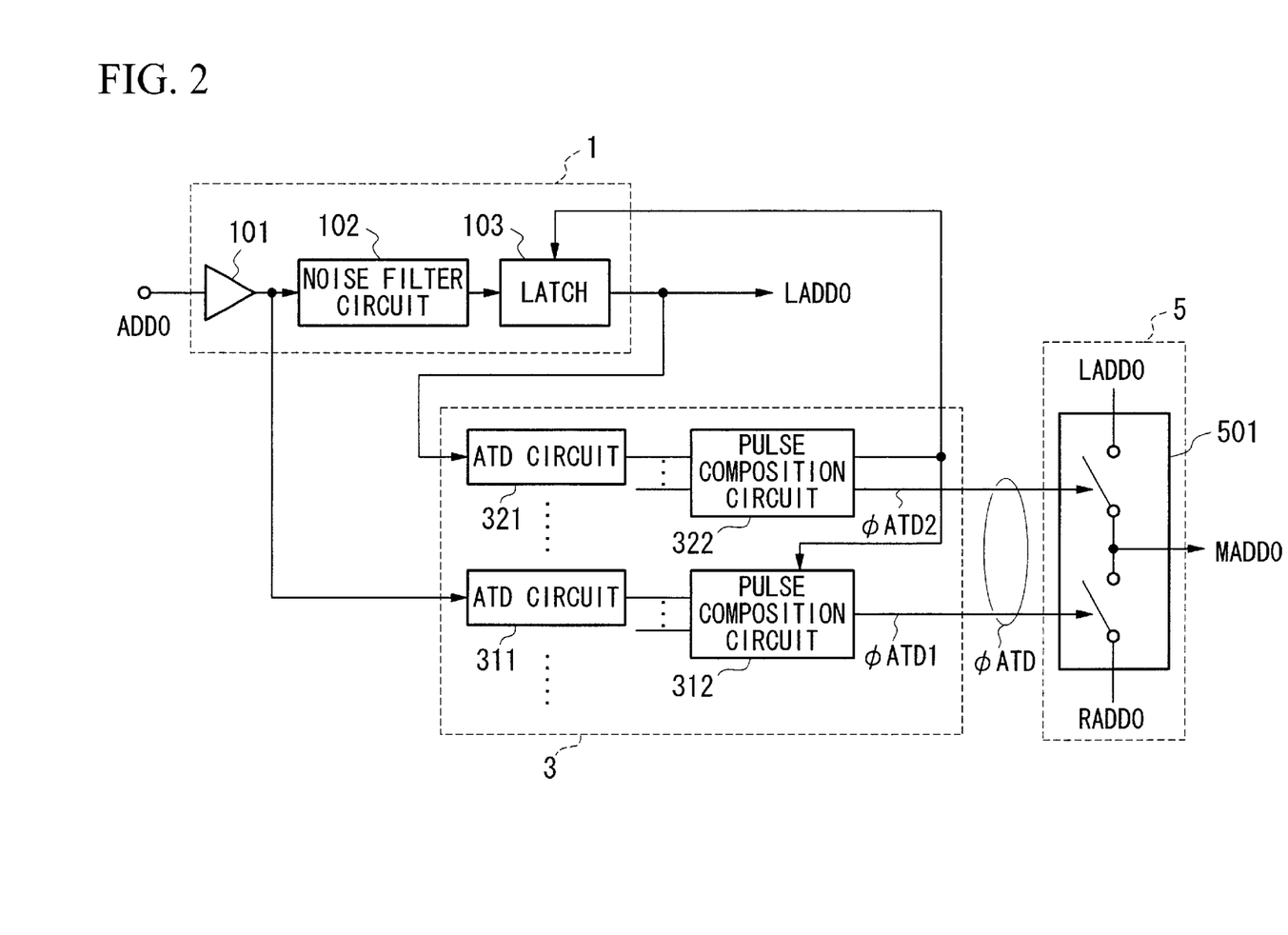
FIG. 2 is a block diagram showing the constitution of the characteristic portions of the semiconductor memory device according to a first embodiment of the present invention.

Next, an explanation is provided of address input system 1, pulse generator 3 and address multiplexer 5 that comprise a characteristic portion of the present invention with reference to FIG. 2.

FIG. 2 shows only the circuit system involved in address signal ADD0 of the least significant bit among addresses ADD provided from the outside. Address input system 1 is composed by containing input buffer 101, noise filter circuit 102 and latch 103. Input buffer 101 receives address signal ADD0 provided from the outside, and converts this to a signal that is compatible inside the device.

Noise filter circuit 102 removes noise of high-frequency components contained in the address signals incorporated from the outside by input buffer 101. The specific constitution of this noise filter circuit 102 is described later. Latch 103 latches address signals from which noise has been removed by noise filter circuit 102 at the rise of latch control signal LC output from latch control circuit 12 shown in FIG. 1, and outputs them in the form of internal addresses LADD. Although not shown in FIG. 2, elements similar to the circuit elements provided for address signal ADD0 are also provided for other address signals ADD1 through ADDn in address input system 1.

Pulse generator 3 is composed by containing address transition detection circuits (ATD circuits) 311 and 321, and pulse composition circuits 312 and 322. Here, address transition detection circuit 311 outputs a one-shot pulse by detecting a change in address signal ADD0 before passing through noise filter circuit 102, while address transition detection circuit 321 outputs a one-shot pulse by detecting a change (transition) in internal address signal LADD0 after passing through noise filter circuit 102. Although only address transition detection circuits 311 and 321 provided for address signal ADD0 are shown, address transition detection circuits are also similarly provided for other address signals ADD1 through ADDn.

In addition to a one-shot pulse output from address transition detection circuit 311 provided for address signal ADD0, pulse composition circuit 312 combines one-shot pulses output from each address transition detection circuit provided for address signals ADD1 through ADDn corresponding to the above address transition detection circuit 311. This pulse composition circuit 312 outputs a one-shut pulse in the form of address transition detection signal φATD1 in the case a change has occurred in any of address signals ADD0 through ADDn prior to passing through noise filter circuit. In addition, this pulse composition circuit 312 is composed so as to receive address transition detection signal φATD2 output from pulse composition circuit 322 described below, and forcibly become inactive for a fixed period of time during read/write operation.

In addition to a one-shot pulse output from address transition detection circuit 321 provided for address signal ADD0, pulse composition circuit 322 combines one-shot pulses output from each address transition detection circuit provided for address signals ADD1 through ADDn corresponding to the above address transition detection circuit 321. This pulse composition circuit 322 outputs a one-shot pulse in the form of address transition detection signal φATD2 in the case a change has occurred in any of internal address signals LADD0 through LADDn that have passed through noise filter circuit 102.

Address transition detection signals φATD1 and φATD2 output from these pulse composition circuits 312 and 322, respectively, are provided to address multiplexer 5 in the form of address transition detection signal φATD.

Address multiplexer 5 is composed by containing switching circuit 501 that selects internal address signal LADD0 or refresh address signal RADD0 and outputs it as address MADD0 based on address transition detection signal φATD provided from pulse generator 3. Although only switching circuit 501 is shown in this example, circuits similar to switching circuit 501 are also provided in address multiplexer 5 for other internal address signals LADD1 through LADDn and other refresh address signals RADD1 through RADDn.

Figure 3A:
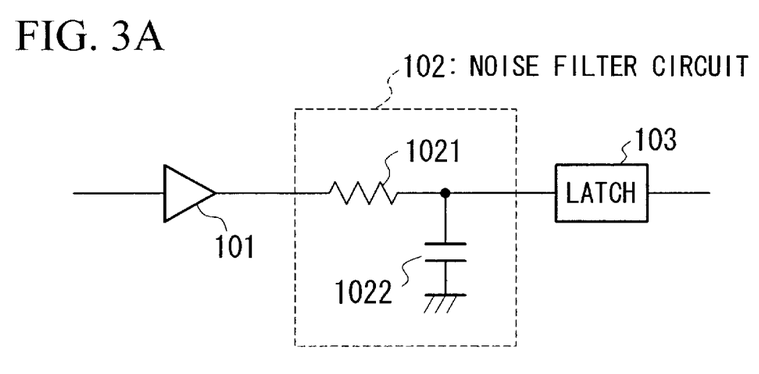
FIG. 3A is a circuit diagram showing a specific example of a filter circuit according to a first embodiment of the present invention.

FIG. 3A shows an example of the constitution of noise filter circuit 102. In FIG. 3A, circuits of the constitution shown in FIG. 1 is shown from input buffer 101 through latch 103. As shown in this drawing, noise filter circuit 102 is composed of resistor 1021 and capacitor 1022. This noise filter circuit 102 can also be interpreted to be a delay circuit for creating a signal delay by resistor 1021 and capacitor 1022. Thus, the filter characteristics of noise filter circuit 102 can also be expressed as the delay time of a delay circuit. In this first embodiment, an amount of delay corresponding to the pulse width of noise in address signals ADD0 through ADDn presumed to be the targets of noise removal is set as a characteristic of noise filter circuit 102.

Figure 3B:
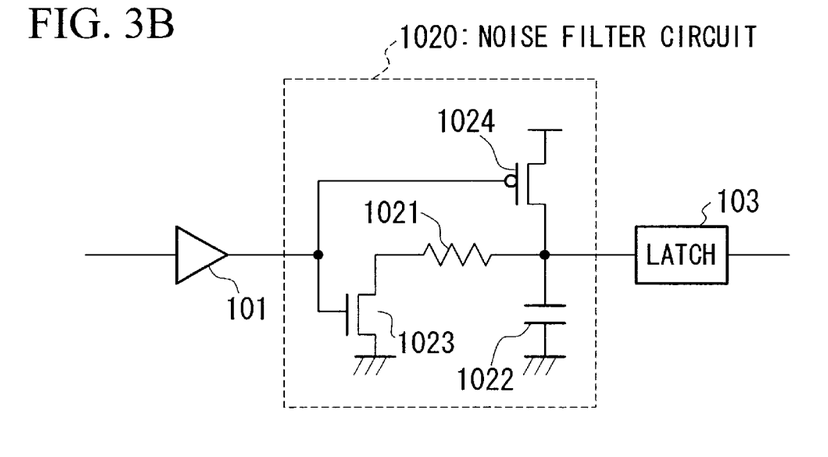
FIG. 3B is a circuit diagram showing another specific example of a filter circuit according to a first embodiment of the present invention.

FIG. 3B shows another example of the constitution of this type of noise filter circuit. Noise filter circuit 1020 shown in this drawing has characteristics such that noise that changes an address signal provided from the outside to the H level is removed in the case this address signal is at the L level, and in addition to the above delay circuit comprised of resistor 1021 and capacitor 1022, is also comprised of n-type MOS (metal oxide semiconductor) transistor 1023 and p-type MOS transistor 1024. Namely, the drain and source of n-type MOS transistor 1023 are respectively connected to the input terminal of resistor 1021 and ground.

In addition, the drain and source of p-type MOS transistor 1024 are respectively connected to the output terminal of resistor 1021 and a power source, and its gate is connected to the output section of the input buffer together with the gate of the above n-type MOS transistor 1023. Similar to the above noise filter circuit 102, the amount of delay of the delay circuit composed of resistor 1021 and capacitor 1022 is set for this noise filter circuit 1020 as well.

Figure 6:
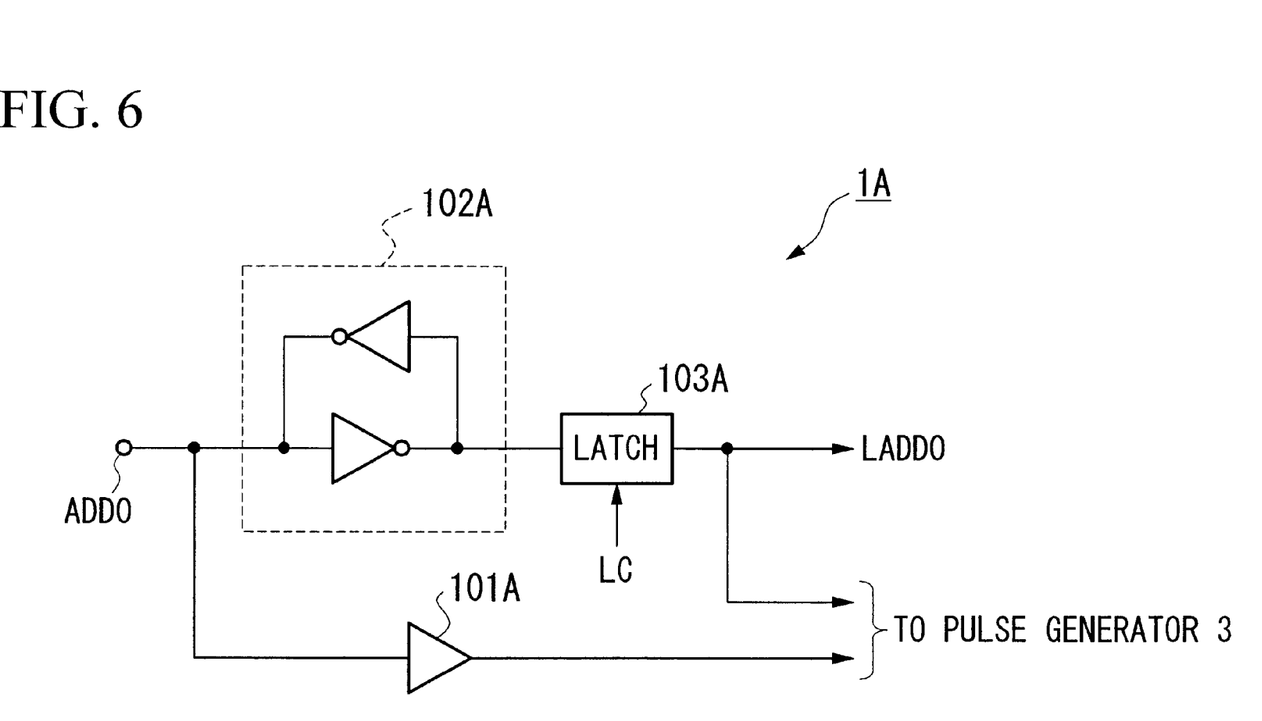
FIG. 6 is a diagram showing an example of the constitution of an address input system according to a second embodiment of the present invention.

In addition, as shown in FIG. 6 to be described later, a flip-flop in which two inverters are cross-coupled, can also be used for a noise filter circuit. In this case, filter characteristics are realized by utilizing the hysteresis between the input and output of the flip-flop.

Next, an explanation is provided of the operation of the semiconductor memory device according to this first embodiment.

Figure 4:
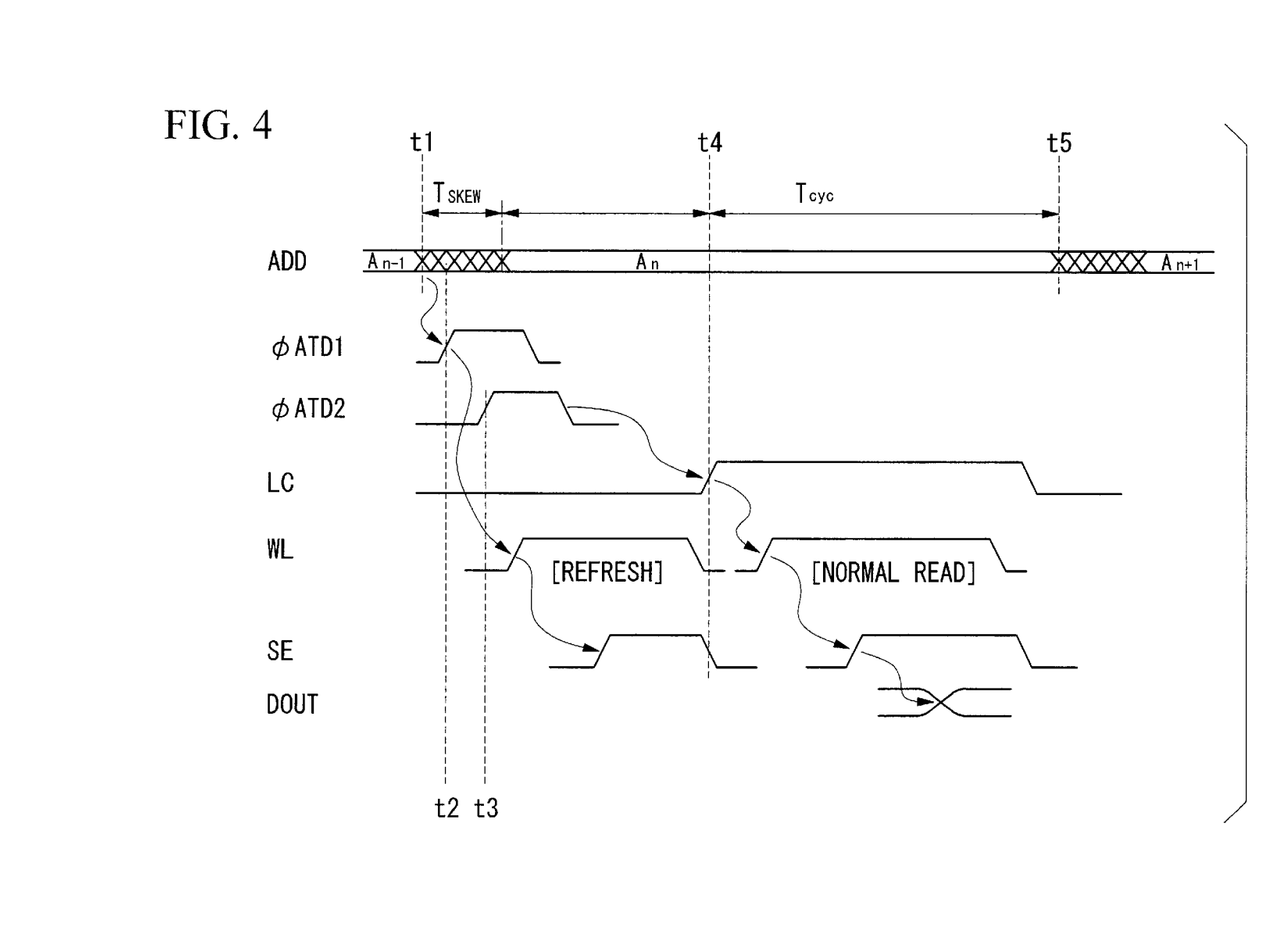
FIG. 4 is a timing chart for explaining the operation (in the case of no noise present) of the semiconductor memory device according to a first embodiment of the present invention.

To begin with, an explanation is provided of the read operation (normal read) in the state in which there is no noise present in an address provided from the outside with reference to FIGS. 2 and 4.

Furthermore, in the following explanation, in the case of having been accessed from the outside, a refresh operation is first carried out followed by a read operation or write operation within the same cycle. In addition, in order to simplify the explanation, only address signal ADD0 provided from the outside is assumed to change.

To begin with, at time t1, together with address signal ADD0 changing and address ADD starting to change from its previous value of "An−1" to "An", a chip select signal /CS not shown is activated. Furthermore, in the case a plurality of address signals have changed, value An of address ADD is finalized following the passage of a skew period $T_{SKEW}$. Address ADD0 that has changed at time t1 is incorporated within the semiconductor memory device via input buffer 101, and after passing through noise filter circuit 102 and latch 103 in the through state, is output from address input system 1 in the form of internal address signal LADD0. Similarly, in the case other address signals ADD 1 through ADDn have changed, internal address signals LADD1 through LADDn are output corresponding to those changes. In the case there is no change in an address signal, the previous internal address is continued.

Next, when address signal ADD0 appearing as an output signal of input buffer 101 changes, address transition detection circuit 311, which composes pulse generator 3, detects this change and outputs a one-shot pulse. When internal address signal LADD0 changes corresponding to the change of external address signal ADD0, the other address transition detection circuit 321 detects this change and outputs a one-shot pulse. At this time, since internal address signal LADD0 changes at a delay roughly corresponding to the amount of the delay in noise filter circuit 102 relative to address signal ADD0 that appears as an output signal of input buffer 101, the one-shot pulse output by address transition detection circuit 321 is similarly delayed relative to the one-shot pulse output by address transition detection circuit 311.

Next, pulse composition circuit 312 receives the one-shot pulse from address transition detection circuit 311, and outputs this one-shot pulse by combining as address transition detection signal φATD1. Switching circuit 501 that composes address multiplexer 5 receives this address transition detection signal φATD1, and outputs address MADD0 by selecting refresh address RADD0 provided from the previously mentioned refresh control circuit 4 as address MADD0. In addition to this address MADD0, address multiplexer 5 selects other refresh addresses RADD 1 through RADDn provided from refresh control circuit 4, and similarly outputs them as addresses MADD1 through MADDn. After a word line WL specified with address MADD is selectively driven to the H level and one row of memory cells is selected at a prescribed timing using the rising edge of address transition detection signal φATD as the origin, sense amplifier enable signal SE is activated and the sense amplifier operates. As a result, data is amplified and a series of refresh operations are carried out.

On the other hand, pulse composition circuit 322 receives a one-shot pulse output from address transition detection circuit 321 at a delay roughly corresponding to the amount of the delay of noise filter 102, and outputs this one-shot pulse by combining as address transition detection signal φATD2. Switching circuit 501 that composes address multiplexer 5 receives this address transition detection signal φATD2, and selects internal address LADD0 output from address input system 1 followed by output of address MADD0. In addition to this address MADD0, address multiplexer 5 similarly outputs other internal addresses LADD1 through LADDn provided from address input system 1 as addresses MADD1 through MADDn.

Next, latch control signal LC is activated and changes to the H level at a prescribed timing (time t4) that uses the falling edge of address transition detection signal φATD2 as the origin. Latch 103 latches value An of address ADD at this time. Subsequently, word line WL specified with the row address contained in address MADD is selectively driven to the H level at a prescribed timing that uses the rising edge of latch control signal LC as the origin, and the data of one row of memory cells is output to each bit line. Subsequently, sense amplifier enable signal SE is activated and the sense amplifier is operated to amplify data and output it to the outside as data DOUT through I/O buffer 10.

Here, in the case a one-shot pulse has been received from address transition detection circuit 321, pulse composition circuit 322 forcibly controls pulse composition circuit 312 to an inactive state. As a result, during the time read operation is carried out, even if external address ADD has changed, pulse composition circuit 312 does not respond to the change and does not output address transition detection signal φATD1. Thus, damage to data can be prevented without the inhibition of an ordinary read operation due to incorrect starting of the refresh operation while the read operation is in progress.

Furthermore, the write operation is similar to the above read operation with the exception of writing data provided from the outside into a memory cell.

In this manner, in an ordinary read/write operation, refresh operation is carried out using address transition detection signal φATD1 output from pulse composition circuit 312 as a trigger, followed by carrying out read/write operation by using address transition detection signal φATD2 output from pulse composition circuit 322 as a trigger. At this time, although address transition detection signal 4 ATD2, which serves as the trigger of the read/write operation, is output at a delay from address transition detection signal φATD1, which serves as the trigger of the refresh operation, since the read/write operation is inherently carried out after the refresh operation, even if address transition detection signal φATD2 is output at a delay from address transition detection signal φATD1, there is no resulting inhibition of the operating speed of the semiconductor memory device.

As has been explained above, a refresh operation and read operation are carried out continuously in sequence within the same cycle with respect to a normal address change.

Figure 5:
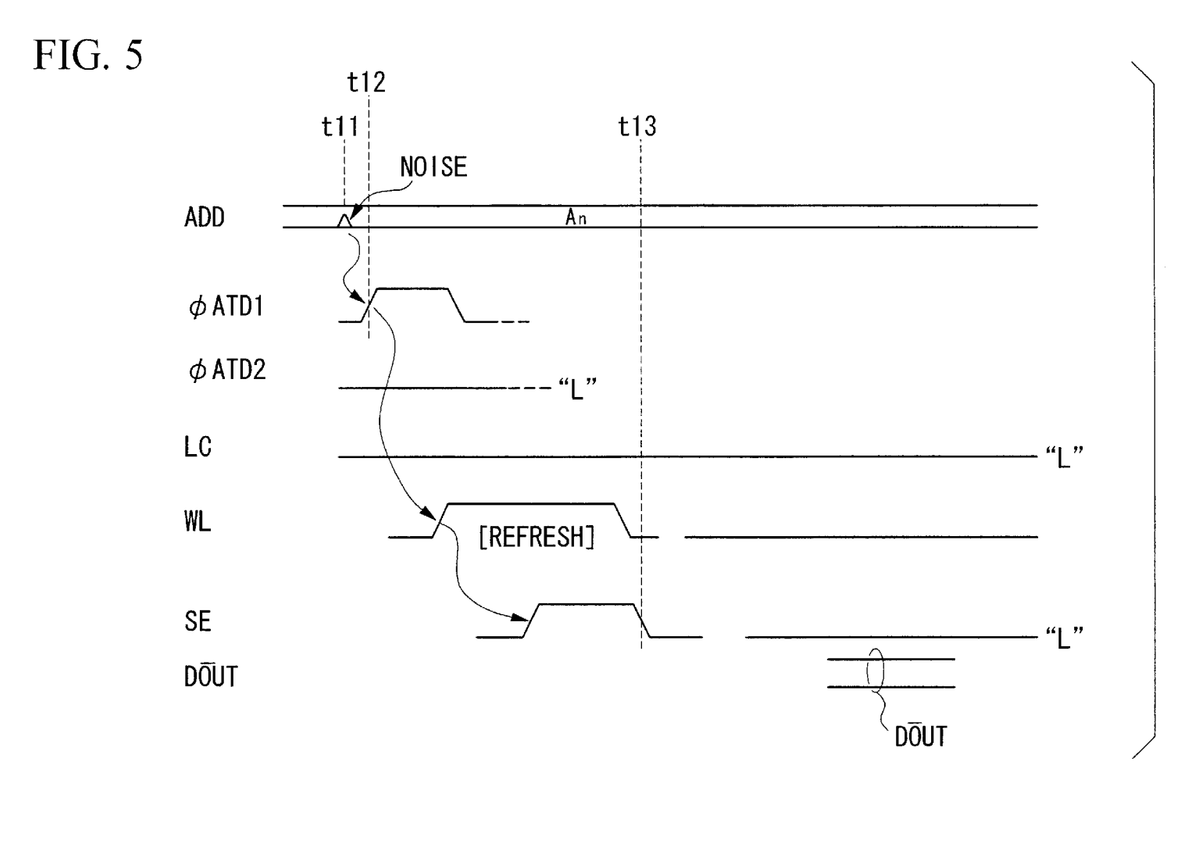
FIG. 5 is a timing chart for explaining the operation (in the case noise is present) of the semiconductor memory device according to a first embodiment of the present invention.

Next, an explanation is provided of operation in the case noise is contained in an address ADD provided from the outside with reference to FIGS. 2 and 5.

In the following explanation, in order to simplify the explanation, noise is assumed to occur in address signal ADD0 in the state in which value An of address ADD is held. In FIG. 5, when noise occurs in address signal ADD0 at time t11, address ADD changes temporarily. This address signal ADD0 containing noise is incorporated within the device through input buffer 10, and is provided to noise filter circuit 102 and address transition detection circuit 311 within pulse generator 3.

Noise filter circuit 102 removes the noise from this address signal ADD0 and provides it to latch 103. The address signal from which noise has been removed passes through latch 103 in the through state and is output as internal address signal LADD0. Similarly, the noise filter circuit also removes noise from other address signals ADD1 through ADDn, after which they are output as internal address signals LADD1 through LADDn. Thus, even if noise is contained in an external address ADD, address value An is retained without any changes in internal address signals LADD0 through LADDn.

Next, when noise occurs in address signal ADD0 appearing as an output signal of input buffer 101, address transition detection circuit 311 of pulse generator 3 detects a change in this address signal ADD0 and outputs a one-shot pulse. Pulse composition circuit 312 receives the one-shot pulse from address transition detection circuit 311, and outputs this one-shot pulse by combining as address transition detection signal φATD1. Since there is no change in internal address signal LADD0, the other address transition detection circuit 321 does not output a one-shot pulse, and its output is held at the L level. Thus, pulse composition circuit 322 does not output address transition detection signal φATD2.

Next, switching circuit 501 that composes address multiplexer 5 receives address transition detection signal φATD 1, and outputs refresh address RADD0 as address MADD0. At this time, in addition to this address MADD0, address multiplexer 5 similarly outputs other refresh addresses RADD1 through RADDn as addresses MADD1 through MADDn. Word line WL specified with address MADD is driven to the H level at a prescribed timing that uses the rising edge of address transition detection signal φATD1 as the origin, and a series of refresh operations are carried out in the same manner as previously described.

Next, as was previously described, since there is no change in the output of address transition detection circuit 321, the other pulse composition circuit 322 does not output address transition detection signal φATD2 that serves as the trigger for read/write operation, and thus even if the refresh operation is finished, latch control signal LC, sense amplifier signal SE and word line WL are each maintained in the inactive state (L level), and the output state of data DOUT prior to the occurrence of noise is maintained.

Furthermore, the write operation is similar to the above read operation with the exception of writing data provided from the outside to a memory cell.

As has been explained above, according to this first embodiment, in a read/write operating mode accompanying a refresh operation, in the case noise is contained in address ADD provided from the outside, only a refresh operation that uses address transition detection signal φATD1 output from pulse composition circuit 311 as a trigger is carried out, while a read/write operation is not carried out in the same cycle. Thus, there is no occurrence of operating current accompanying a read/write operation caused by noise contained in an address, and consumption current can be effectively suppressed. In addition, since a read/write operation is started after a refresh operation by detecting a change in an address signal from which noise has been removed by a noise filter circuit, the amount of delay in the noise filter circuit is not actualized, and there is no impairment of read and write operating speeds.

<Second Embodiment>

The following provides an explanation of a second embodiment of the present invention.

Although the respective input signals of ATD circuits 311 and 312 that compose pulse generator 3 are obtained from the output signal of input buffer 101 after an address signal is temporarily received from the outside by this input buffer 101 in the previously mentioned first embodiment, in this second embodiment, the address input system is composed so that address signals from the outside are input directly to a noise filter circuit.

FIG. 6 shows an example of the constitution of the address input system according to this second embodiment.

This address input system corresponds to address input system 1 shown in the previously mentioned FIG. 2, and is composed to contain input buffer 101A, noise filter 102A and latch 103A. Here, input buffer 101A inputs address signal ADD0 from the outside, and provides this to ATD circuit 311 of pulse generator 3. Noise filter 102A directly inputs address signal ADD0 from the outside, and removes noise contained in this address signal ADD0. In this example, noise filter circuit 102A is composed of a flip-flop in which two inverters are cross-coupled.

Latch 103A latches the address signal from which noise has been removed by noise filter 102A at the rise of latch control signal LC, and outputs this as internal address LADD0. Together with this internal address being used to select a row of memory cells not shown, it is also provided to ATD circuit 321 that composes pulse generator 3, and is used to generate an address transition detection signal for controlling read/write operation. Although not shown in FIG. 6, elements similar to the circuit elements provided for address ADD0 are also provided for other address signals ADD1 through ADDn.

The following provides a brief explanation of the operation of this address input system according to this second embodiment.

Address signals provided from the outside are input directly to noise filter circuit 102A without going through an input buffer. Address signals that have passed through noise filter circuit 102A are latched by latch 103A at a prescribed timing, and output as internal addresses. On the other hand, address signals provided from the outside are also input to input buffer 101A, and then output to pulse generator 3. Pulse generator 3 respectively inputs the address signals from latch 103A and input buffer 101A, and generates the above address transition detection signal φATD.

Next, an explanation is provided of the significance of the noise filter circuit being composed of a flip-flop, and address signals from the outside being input directly into this noise filter circuit. As in the example shown in the previously mentioned FIG. 2, in the case address signals are input to a noise filter circuit through an input buffer, the input buffer amplifies the noise when it picks up that noise, and then outputs a short pulse having an amplitude of the power source voltage. Although this short pulse (noise) can be removed in the noise filter circuit, consumption current is generated due to the operation of this noise filter circuit.

In contrast, according to the address input system of this second embodiment, by adjusting the inverter threshold value of the flip-flop that composes noise filter circuit 102A so as to lower the sensitivity to noise, tolerance is improved to analog noise caused by fluctuations in the power source and so forth. Moreover, since noise does not substantially pass through the noise filter as long as the state of the flip-flop that composes noise filter circuit 102A is inverted, the operation of the circuit system on the output side of this noise filter 102A is stabilized.

In addition, in the example shown in the above FIG. 2, since the input threshold value of input buffer 101 to which address signals are input from the outside is dependent on power source voltage, there is susceptibility to the occurrence of deviation between the level of an external address signal and the input threshold value of the input buffer. Thus, when the power source voltage fluctuates, the level of the external address signal changes relative to the input threshold value of input buffer 101, thereby causing a malfunction. In contrast, according to the constitution of the address input system of this second embodiment, since noise filter circuit 102A is provided in the initial stage, infiltration of noise can be effectively suppressed due to the hysteresis characteristics of the flip-flop of this noise filter circuit 102A.

Although the above has provided an explanation of first and second embodiments of the present invention, this invention is not limited to these embodiments, but rather includes design changes and so forth within a range that does not deviate from the gist of the invention. For example, although pulse composition circuit 312 is forcibly controlled to the inactive state in the case pulse composition circuit 322 has received a one-shot pulse from address transition detection circuit 321 in the above embodiments, it is not limited to this, but rather, for example, a circuit system such as address multiplexer 5 that is involved with operation may be controlled directly to prohibit operation.

In addition, although that composed of a resistor and capacitor are used for the noise filter circuit in the above embodiments, it is not limited to this, but rather may be any means capable of removing noise, such as that which utilizes the hysteresis between input and output in the manner of a flip-flop, or an inverter chain.

Moreover, although a change in an address signal before and after passing through a noise filter is detected for all bits that compose an external address ADD, this is not limited to this, but rather the present invention may be applied only with respect to those circuit systems involved in row addresses used for both the refresh operation and read/write operation, and the present invention may be applied in any manner provided it in fact prohibits read/write operation.

Moreover, although an address transition detection circuit is provided on the side of a pulse generator, it is not limited to this, but rather may also include the side of the address input system.

In addition, although the semiconductor memory device according to each of the above embodiments may naturally be in a form in which the entire circuit shown, for example, in FIG. 1 is mounted on a single chip, it may also be in a form in which the entire circuit is divided among several functional blocks, and each functional block is mounted on a separate chip. A possible example of the latter is a hybrid IC (integrated circuit) in which a control section, which generates various control signals and address signals, and a memory cell section, are mounted on separate chips (control chip and memory chip). In other words, a constitution in which various control signals from a control chip provided outside a memory chip are supplied to the memory chip belongs within the scope of the present invention.

INDUSTRIAL APPLICABILITY

The present invention provides technology for realizing a semiconductor memory device capable of effectively suppressing the generation of operating noise originating in the noise of address signals provided from the outside without impairing the operating speed during read/write operation.

What is claimed is:

1. A semiconductor memory device comprising:

a memory cell array composed by arranging memory cells containing data storage capacitors in a matrix;

a filter circuit that removes noise contained in an address signal provided from the outside;

a first signal transition detection circuit system that generates a first pulse signal for controlling refresh operation by detecting a change in an address signal prior to passing through the filter circuit;

a second signal transition detection circuit system that generates a second pulse signal for controlling read/write operation by detecting a change in an address signal after passing through the filter circuit; and a control system that sequentially performs the refresh operation and the read/write operation within the same cycle by using the first and second pulse signals as triggers.

2. The semiconductor memory device according to claim 1, wherein the second signal transition detection circuit system controls the first signal transition detection circuit system in an inactive state by detecting a change in an address signal that has passed through the filter circuit.

3. The semiconductor memory device according to claim 1, wherein the control system controls the refresh operation based on the first pulse signal, and controls the read/write operation based on the second pulse signal.

4. The semiconductor memory device according to claim 1, further comprising a row decoder circuit for selecting a row of the memory cell array, wherein the control system is composed to include an address multiplexer that selects either a read/write address signal generated from an address signal that has passed through the filter circuit or a refresh address signal generated in advance within the device based on the first and second pulse signals, and supplies a selected address signal to the row decoder circuit.

5. The semiconductor memory device according to claim 1, wherein the filter circuit is composed to include a delay circuit having a delay amount corresponding to the pulse width of presumed noise targeted for removal.

6. The semiconductor memory device according to claim 1, wherein the filter circuit is composed of a flip-flop that directly inputs the address signal from the outside.

7. The semiconductor memory device according to claim 1, wherein the filter circuit has characteristics that remove noise that causes an address signal provided from the outside to change to the H level in the case the address signal is at the L level.

8. The semiconductor memory device according to claim 1, wherein the second signal transition detection circuit system prohibits operation by the control system by detecting a change in an address signal that has passed through the filter circuit.

9. A control method of a semiconductor memory device comprising the steps of:

generating a first pulse signal for controlling refresh operation of a memory cell array composed by arranging memory cells containing data storage capacitors in a matrix by detecting a change in an address signal provided from outside the semiconductor memory device;

removing noise contained in the address signal provided from the outside;

generating a second pulse signal for controlling read/write operation of the memory cell array by detecting a change in the address signal from which noise has been removed; and sequentially performing the refresh operation and the read/write operation within the same cycle by using the first and second pulse signals as triggers.

10. The control method of a semiconductor memory device according to claim 9, wherein the generation of the fist pulse signal is prohibited over a prescribed time period by detecting a change in the address signal from which noise has been removed.

11. The control method of a semiconductor memory device according to claim 9, wherein either a read/write address signal generated from the address signal from which noise has been removed or a refresh address signal generated in advance within the semiconductor memory device is selected based on the first and second pulse signals, and a decoding operation is performed to select a row of the memory cell array.

12. The control method of a semiconductor memory device according to claim 9, wherein an operation is performed for removing noise contained in the address signal provided from the outside over period of time corresponding to the pulse width of presumed noise targeted for removal.

13. The control method of a semiconductor memory device according to claim 9, wherein noise is removed from an address signal input directly from outside the semiconductor memory device.

14. The semiconductor memory device according to claim 1, wherein the first signal transition detection circuit system and the second signal transition detection circuit system respectively generate the first pulse signal and the second pulse signal by detecting a change in a chip select signal for controlling the standby state and active state of the semiconductor memory device.

* * * * *